(12) United States Patent
Hinode et al.

(10) Patent No.: US 10,790,134 B2
(45) Date of Patent: Sep. 29, 2020

(54) SUBSTRATE PROCESSING METHOD

(71) Applicant: SCREEN Holdings Co., Ltd., Kyoto (JP)

(72) Inventors: Taiki Hinode, Kyoto (JP); Takashi Ota, Kyoto (JP)

(73) Assignee: SCREEN Holdings Co., Ltd. (JP)

(*) Notice: Subject to any disclaimer, the term of this patent is extended or adjusted under 35 U.S.C. 154(b) by 226 days.

(21) Appl. No.: 15/700,236

(22) Filed: Sep. 11, 2017

(65) Prior Publication Data

US 2018/0090342 A1 Mar. 29, 2018

(30) Foreign Application Priority Data

Sep. 26, 2016 (JP) .................. 2016-187249

(51) Int. Cl.
| | |
|---|---|
| *H01L 21/02* | (2006.01) |
| *B08B 3/04* | (2006.01) |
| *H01L 21/311* | (2006.01) |
| *H01L 21/67* | (2006.01) |
| *H01L 21/687* | (2006.01) |

(52) U.S. Cl.
CPC ......... *H01L 21/02057* (2013.01); *B08B 3/04* (2013.01); *H01L 21/31111* (2013.01); *H01L 21/67028* (2013.01); *H01L 21/67051* (2013.01); *H01L 21/67057* (2013.01); *H01L 21/68735* (2013.01)

(58) Field of Classification Search
None
See application file for complete search history.

(56) References Cited

U.S. PATENT DOCUMENTS

| | | | |
|---|---|---|---|
| 2001/0054431 A1* | 12/2001 | Masui .................. | B08B 3/08 134/3 |
| 2003/0172955 A1 | 9/2003 | Kuroda et al. ................. | 134/2 |
| 2006/0219264 A1 | 10/2006 | Miya .............................. | 134/21 |
| 2007/0113872 A1 | 5/2007 | Uchida et al. .................. | 134/26 |
| 2008/0110861 A1 | 5/2008 | Kajita et al. .................... | 216/83 |
| 2014/0014134 A1 | 1/2014 | Ogata et al. ..................... | 134/6 |
| 2014/0299163 A1* | 10/2014 | Ishibashi .......... | H01L 21/02052 134/33 |

(Continued)

FOREIGN PATENT DOCUMENTS

| | | | |
|---|---|---|---|
| CN | 104779183 A | | 7/2015 |
| EP | 1233441 | * | 8/2002 |

(Continued)

*Primary Examiner* — Mikhail Kornakov
*Assistant Examiner* — Ryan L. Coleman
(74) *Attorney, Agent, or Firm* — Ostrolenk Faber LLP

(57) ABSTRACT

A substrate processing method includes a substrate holding step of holding a substrate by means of a substrate holder which holds the substrate horizontally with an interval upward from an upper surface of a base, a first processing liquid supplying step of supplying a first processing liquid to an upper surface of the substrate held by the substrate holder, a cleaning liquid supplying step of supplying a cleaning liquid so as to wash away the first processing liquid attached to the upper surface of the base, to the upper surface of the base such that the cleaning liquid on the base does not contact a lower surface of the substrate held by the substrate holder, and a removing step of removing the cleaning liquid from the upper surface of the base.

9 Claims, 7 Drawing Sheets

(56) References Cited

U.S. PATENT DOCUMENTS

| | | | |
|---|---|---|---|
| 2014/0331927 A1 | 11/2014 | Nakano et al. | 118/641 |
| 2015/0040951 A1* | 2/2015 | Yoshizumi | H01L 21/67051 |
| | | | 134/26 |
| 2015/0090301 A1 | 4/2015 | Higuchi et al. | 134/23 |
| 2015/0090302 A1 | 4/2015 | Fujiwara et al. | 134/26 |
| 2015/0090694 A1 | 4/2015 | Hashimoto et al. | 216/83 |
| 2015/0200087 A1 | 7/2015 | Kobayashi | |
| 2016/0049308 A1 | 2/2016 | Hinode et al. | |

FOREIGN PATENT DOCUMENTS

| | | |
|---|---|---|
| JP | 09-232276 A | 9/1997 |
| JP | H10-137664 A | 5/1998 |
| JP | 2000-156362 A | 6/2000 |
| JP | 2003-224100 A | 8/2003 |
| JP | 2005-101629 A | 4/2005 |
| JP | 2006-278654 A | 10/2006 |
| JP | 2013-211377 A | 10/2013 |
| JP | 2014-033178 A | 2/2014 |
| JP | 2014-241390 A | 12/2014 |
| JP | 2015-070019 A | 4/2015 |
| JP | 2016-042503 A | 3/2016 |
| KR | 10-2007-0035476 A | 3/2007 |
| TW | I531423 B | 5/2016 |

\* cited by examiner

FIG. 5 FIRST CHEMICAL LIQUID PROCESSING (S3)
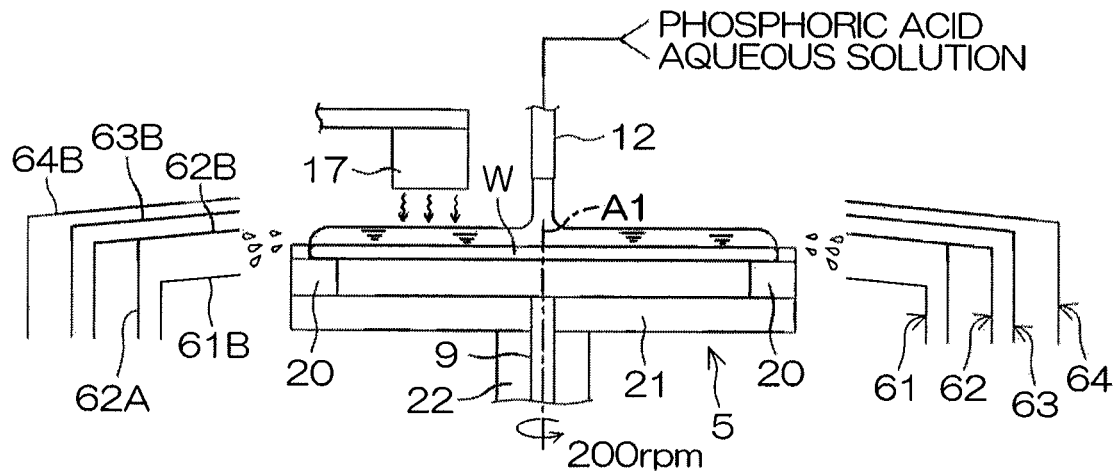
FIG. 6 RINSE PROCESSING (S4)
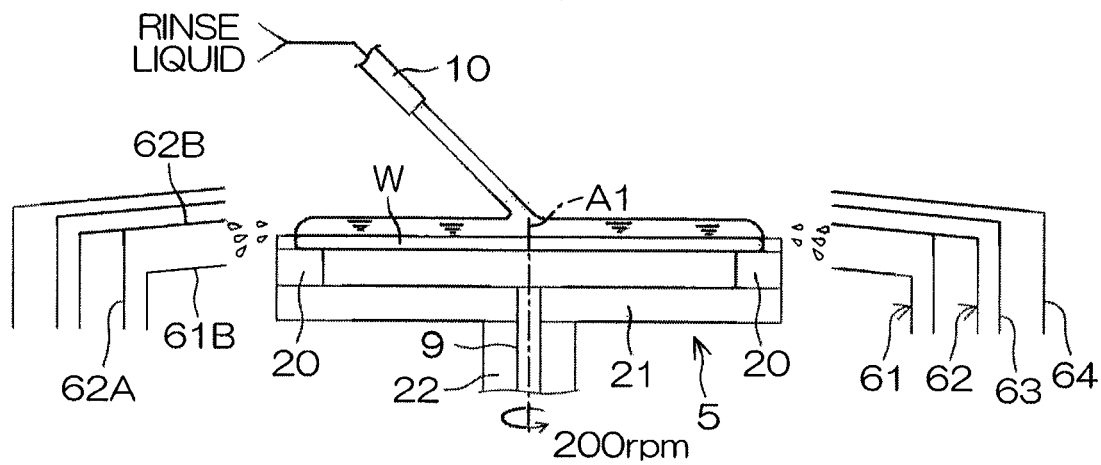
FIG. 7 GUARD CLEANING (S5)
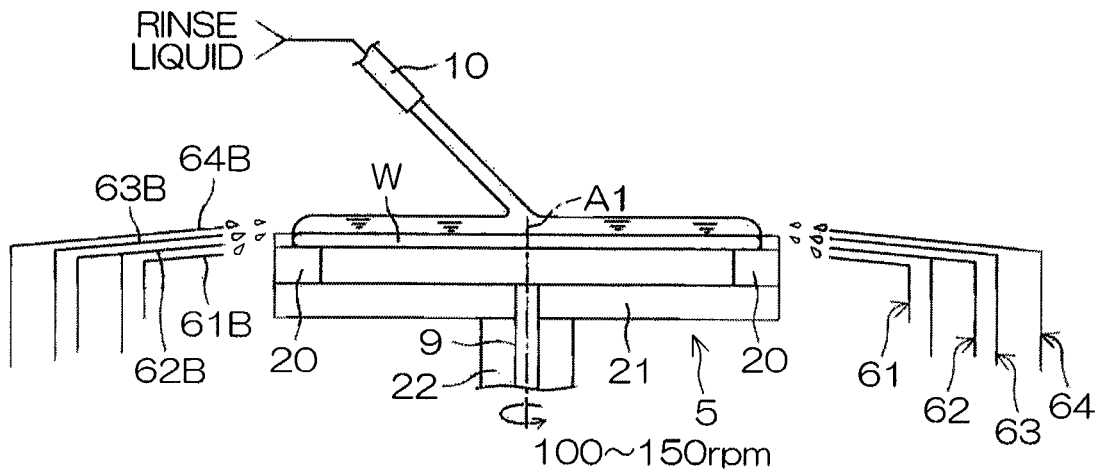

FIG. 8A BASE CLEANING (S6)
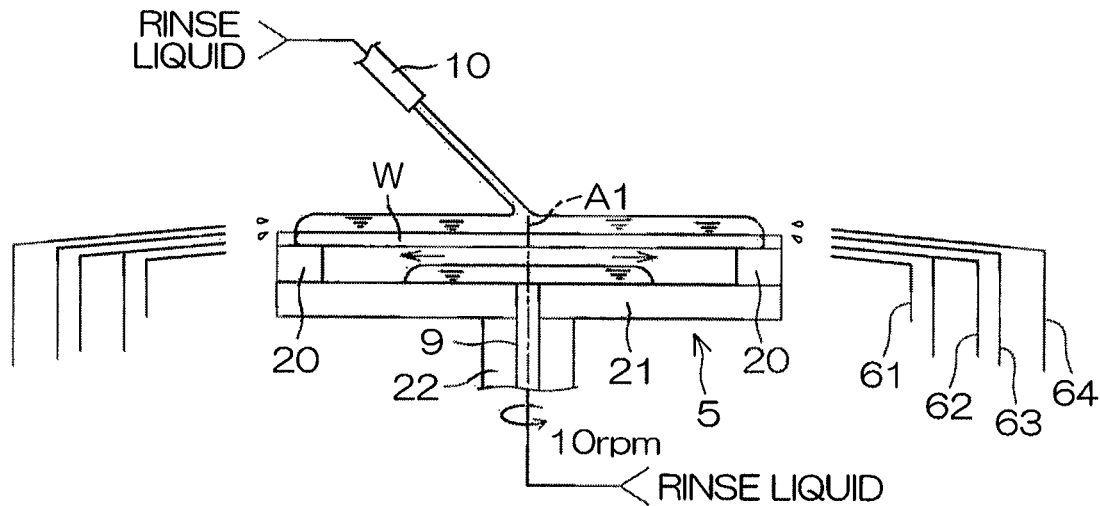
FIG. 8B BASE CLEANING (S6)
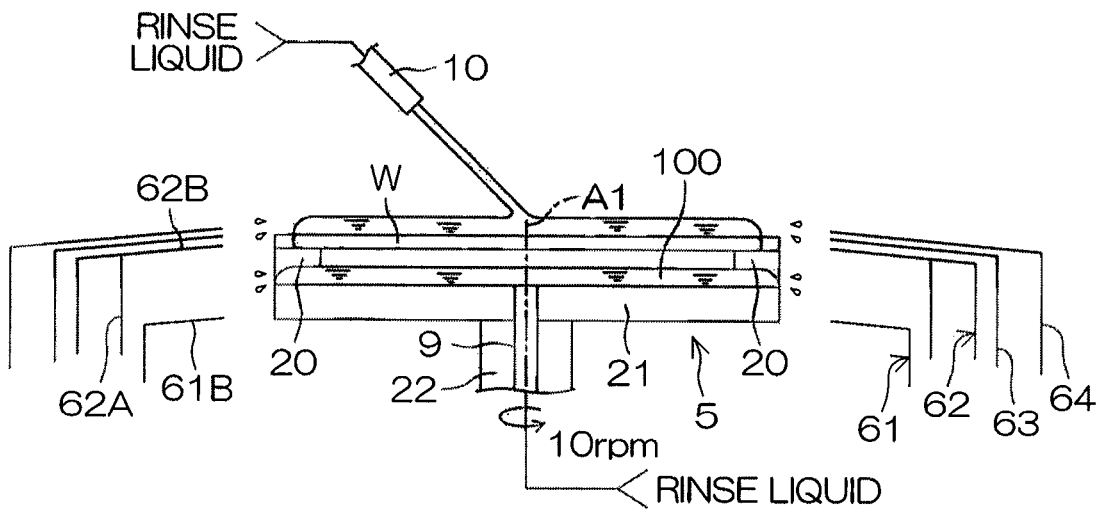
FIG. 8C BASE CLEANING (S6)
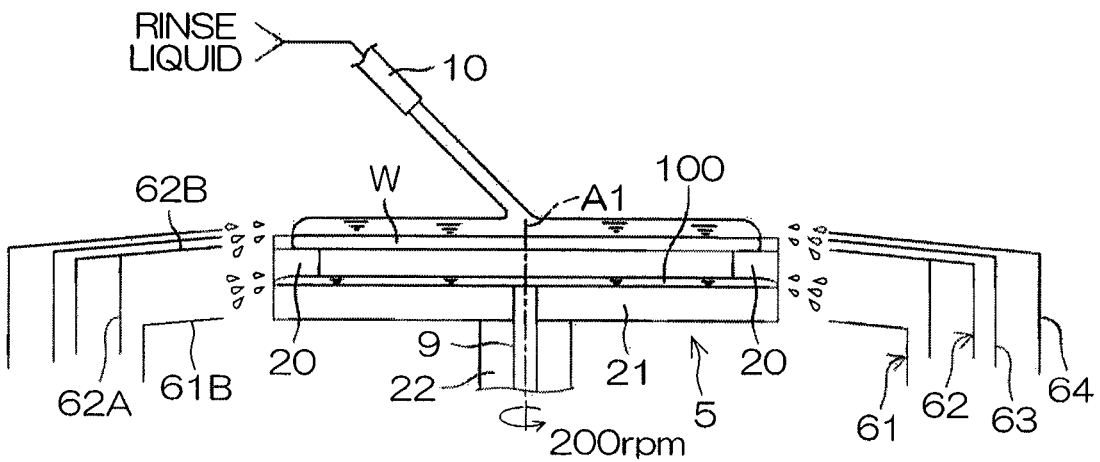

FIG. 9 SECOND CHEMICAL LIQUID PROCESSING (S7)
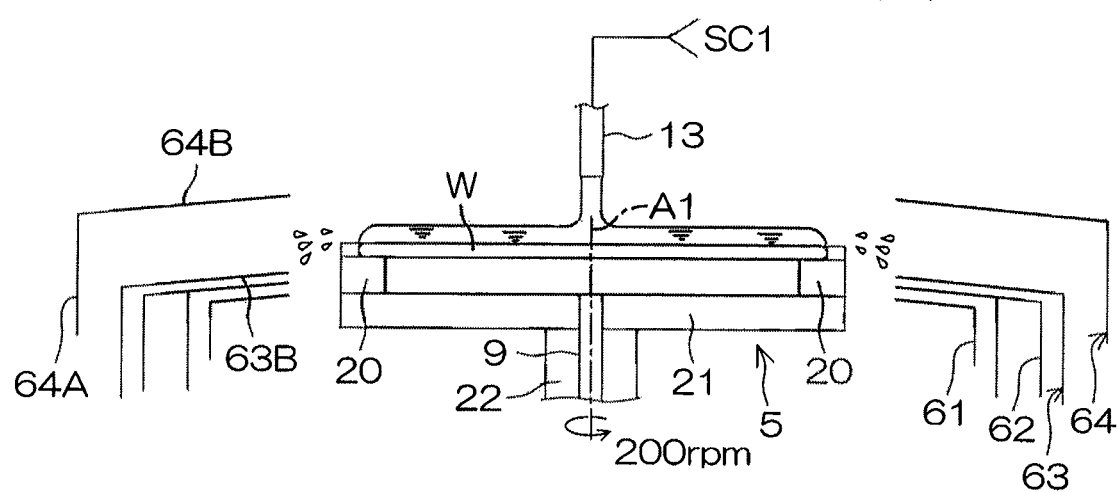

SUBSTRATE PROCESSING METHOD

BACKGROUND OF THE INVENTION

1. Field of the Invention

The present invention relates to a substrate processing method by which a substrate is processed. Examples of substrates to be processed include substrates such as semiconductor wafers, substrates for liquid crystal displays, substrates for plasma displays, substrates for FEDs (field emission displays), substrates for optical disks, substrates for magnetic disks, substrates for magneto-optical disks, substrates for photomasks, ceramic substrates, substrates for solar cells, etc.

2. Description of the Related Art

In substrate processing with a single substrate processing type substrate processing apparatus that processes substrates one by one, a substrate is processed, for example, by a chemical liquid or other processing liquid being supplied to the substrate that is held above a spin base by holding pins. In this process, a portion of the chemical liquid supplied to the substrate may fall down from the substrate and become attached to an upper surface of the spin base, and the spin base may thereby be contaminated. The spin base must thus be cleaned.

As a method for cleaning the spin base, a method may be considered, where, from a standpoint of convenience of cleaning, the spin base is cleaned after the substrate processing is ended and the substrate is removed from the holding pins. However, with this cleaning method, the chemical liquid attached to the upper surface of the spin base may dry before the spin base is cleaned so that crystals and other particles form on the upper surface of the spin base. In this case, the particles may float inside the substrate processing apparatus and the substrate may become contaminated due to the particles floating inside the substrate processing apparatus becoming attached to the substrate.

Also as a method for cleaning the substrate, a method may be considered where the substrate processing is interrupted in the middle and the substrate is removed once from the holding pins and the base is cleaned, after which the substrate is held by the holding pins again and the substrate processing is restarted. However, with this cleaning method, time is required to hold and remove the substrate. Throughput (number of substrates processed per unit time) of substrate processing by the substrate processing apparatus may therefore decrease.

A method has thus been proposed where, by supplying the chemical liquid toward a lower surface of the substrate from a nozzle which is provided at the spin base, the upper surface of the spin base is cleaned in a state where the substrate is held by the holding pins. For example, with a substrate processing method described in United States Patent Application Publication No. 2007/113872, a cleaning liquid is supplied between a lower surface of a substrate and an upper surface of a spin base from a discharge port opening at a central portion of the upper surface of the spin base. A liquid film of the cleaning liquid is thereby formed such that a gap between the lower surface of the substrate and the upper surface of the spin base is sealed by liquid. Rinse processing is applied to the upper surface of the spin base by the liquid film of the cleaning liquid.

SUMMARY OF THE INVENTION

With the substrate processing method described in US Patent Application Publication No. 2007/113872, when applying the rinse processing to the upper surface of the spin base, the liquid film of the cleaning liquid is formed on the upper surface of the spin base and the liquid film is put in contact with the lower surface of the substrate. With such a configuration, a contaminant attached to the spin base may become attached (transferred) to the lower surface of the substrate via the cleaning liquid.

Therefore, one object of the present invention is to provide a substrate processing method that is capable of suppressing decrease of throughput and enables a base to be cleaned while contamination of a substrate held by a substrate holder is suppressed.

The present invention provides a substrate processing method including a substrate holding step of holding a substrate by means of a substrate holder which holds the substrate horizontally with an interval upward from an upper surface of a base, a first processing liquid supplying step of supplying a first processing liquid to an upper surface of the substrate held by the substrate holder, a cleaning liquid supplying step of supplying a cleaning liquid, so as to wash away the first processing liquid attached to the upper surface of the base, to the upper surface of the base such that the cleaning liquid on the base does not contact a lower surface of the substrate held by the substrate holder, and a removing step of removing the cleaning liquid from the upper surface of the base.

With the present method, the upper surface of the substrate, which is held horizontally by the substrate holder with an interval upward from the upper surface of the base, is processed by the first processing liquid that is supplied to the upper surface of the substrate. Even if the first processing liquid falls down from the upper surface of the substrate and becomes attached to the upper surface of the base, the upper surface of the base, to which the first processing liquid is attached, can be washed by the cleaning liquid, by supplying the cleaning liquid to the upper surface of the base and thereafter removing the cleaning liquid from the upper surface of the base. The base can thus be cleaned before the first processing liquid attached to the base dries. Forming of particles can thus be suppressed.

Also with the present method, the upper surface of the base is cleaned in a state where the substrate is held by the substrate holder. Decrease of throughput of substrate processing due to the cleaning of the base can thus be suppressed. When the upper surface of the base is cleaned, the cleaning liquid is supplied to the upper surface of the base such that the cleaning liquid on the base does not contact the lower surface of the substrate held by the substrate holder. A contaminant attached to the base is thus suppressed from becoming attached to the lower surface of the substrate via the cleaning liquid. Decrease of throughput can thus be suppressed and the base can be cleaned while contamination of the substrate is suppressed.

In the preferred embodiment of the present invention, the substrate processing method further includes a liquid film forming step of supplying the cleaning liquid to the upper surface of the base to form a liquid film of the cleaning liquid that covers the upper surface of the base without contacting the lower surface of the substrate held by the substrate holder.

With the present method, the liquid film of the cleaning liquid is formed on the upper surface of the base by supplying the cleaning liquid to the upper surface of the base. The upper surface of the base is covered by the liquid film and therefore the upper surface of the base can be cleaned uniformly. Also with the present method, the liquid film does not contact the lower surface of the substrate held by the substrate holder. A contaminant attached to the base is thus suppressed from becoming attached to the lower surface of the substrate via the cleaning liquid. The base can thus be cleaned sufficiently while contamination of the substrate is suppressed.

In the preferred embodiment of the present invention, the cleaning liquid supplying step includes a step of supplying the cleaning liquid to the upper surface of the base such that the cleaning liquid does not become attached to the lower surface of the substrate held by the substrate holder. With the present method, the cleaning liquid does not become attached to the lower surface of the substrate held by the substrate holder and contamination of the lower surface of the substrate can thus be suppressed further.

In the preferred embodiment of the present invention, the substrate processing method further includes a rotating step of rotating, in parallel with the first processing liquid supplying step and the cleaning liquid supplying step, the substrate together with the base around a rotational axis along a vertical direction. Also, the rotational speed of the substrate in the cleaning liquid supplying step is lower than the rotational speed of the substrate in the first processing liquid supplying step.

With the present method, the substrate is rotated at a comparatively high speed in the first processing liquid supplying step and therefore the upper surface of the substrate can be processed rapidly by the first processing liquid.

Here, a centrifugal force acting on the cleaning liquid in a vicinity of a peripheral edge of the upper surface of the base is large in comparison to a centrifugal force acting on the cleaning liquid at a portion of the upper surface of the base in a vicinity of the rotational axis. A movement speed of the cleaning liquid in the vicinity of the peripheral edge of the upper surface of the base is thus higher than a movement speed of the cleaning liquid at the portion of the upper surface of the base in the vicinity of the rotational axis. A portion of the upper surface of the base in the vicinity of the peripheral edge is thus less readily cleaned than the portion of the upper surface of the base in the vicinity of the rotational axis.

The base is thus rotated at a comparatively low speed in the cleaning liquid supplying step such that the centrifugal force acting on the cleaning liquid on the base when the cleaning liquid reaches the vicinity of the peripheral edge of the upper surface of the base is reduced. The movement speed of the cleaning liquid on the base in the vicinity of the peripheral edge is thus reduced. The peripheral edge of the upper surface of the base can thus be cleaned sufficiently.

Contamination of the substrate can thus be suppressed further while the decrease of throughput is suppressed further.

In the preferred embodiment of the present invention, the cleaning liquid supplying step includes a step of supplying the cleaning liquid to the upper surface of the base from a nozzle exposed at the upper surface of the base.

With the present method, the cleaning liquid is supplied to the upper surface of the base from the nozzle exposed at the upper surface of the base. Therefore, there is no need to aim between the base and the substrate from outside the base in supplying the cleaning liquid. The base can thus be cleaned comparatively readily. Time required for cleaning the base can thus be reduced. The decrease of throughput can thus be suppressed further.

In the preferred embodiment of the present invention, the substrate processing method further includes a second processing liquid supplying step of supplying a second processing liquid which forms a salt by being mixed with the first processing liquid supplied to the upper surface of the substrate in the first processing liquid supplying step, to the upper surface of the substrate after the removing step.

With the present method, after the first processing liquid is removed, together with the cleaning liquid, from the base, the second processing liquid is supplied to the upper surface of the substrate held by the substrate holder. The first processing liquid is thus already removed from the base when the second processing liquid is supplied to the substrate. Therefore, even if a portion of the second processing liquid, supplied to the upper surface of the substrate, becomes attached to the upper surface of the base, the salt (particles), which is formed by the mixing of the first processing liquid and the second processing liquid on the base, is unlikely to form. Contamination of the substrate can thus be suppressed in a method where the upper surface of the substrate is processed by the second processing liquid after processing the upper surface of the substrate by the first processing liquid.

In the preferred embodiment of the present invention, the first processing liquid is one of either of an acidic aqueous solution and a basic aqueous solution, and the second processing liquid is the other of either of the acidic aqueous solution and the basic aqueous solution.

With the present method, the processing liquid is one of either of the acidic aqueous solution and the basic aqueous solution, and the second processing liquid is the other of either of the acidic aqueous solution and the basic aqueous solution. A salt tends to be formed when an acidic aqueous solution and a basic aqueous solution are mixed. Therefore, with the present method, the first processing liquid is already removed from the base before the second processing liquid is supplied to the upper surface of the substrate. Therefore, even if a portion of the second processing liquid, supplied to the upper surface of the substrate, becomes attached to the upper surface of the base, the salt, formed by the mixing of the acidic aqueous solution and the basic aqueous solution, is suppressed from forming on the base.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 5 is an illustrative sectional, view for explaining the details of a first chemical liquid processing (S3 of FIG. 4).

FIG. 6 is an illustrative sectional view for explaining the details of a first rinse processing (S4 of FIG. 4).

FIG. 7 is an illustrative sectional view for explaining the details of guard cleaning (S5 of FIG. 4).

FIG. 8A to FIG. 8C are illustrative sectional views for explaining the details of base cleaning (S6 of FIG. 4).

FIG. 9 is an illustrative sectional view for explaining the details of a second chemical liquid processing (S7 of FIG. 4).

DETAILED DESCRIPTION OF THE PREFERRED EMBODIMENT

Figure 1:
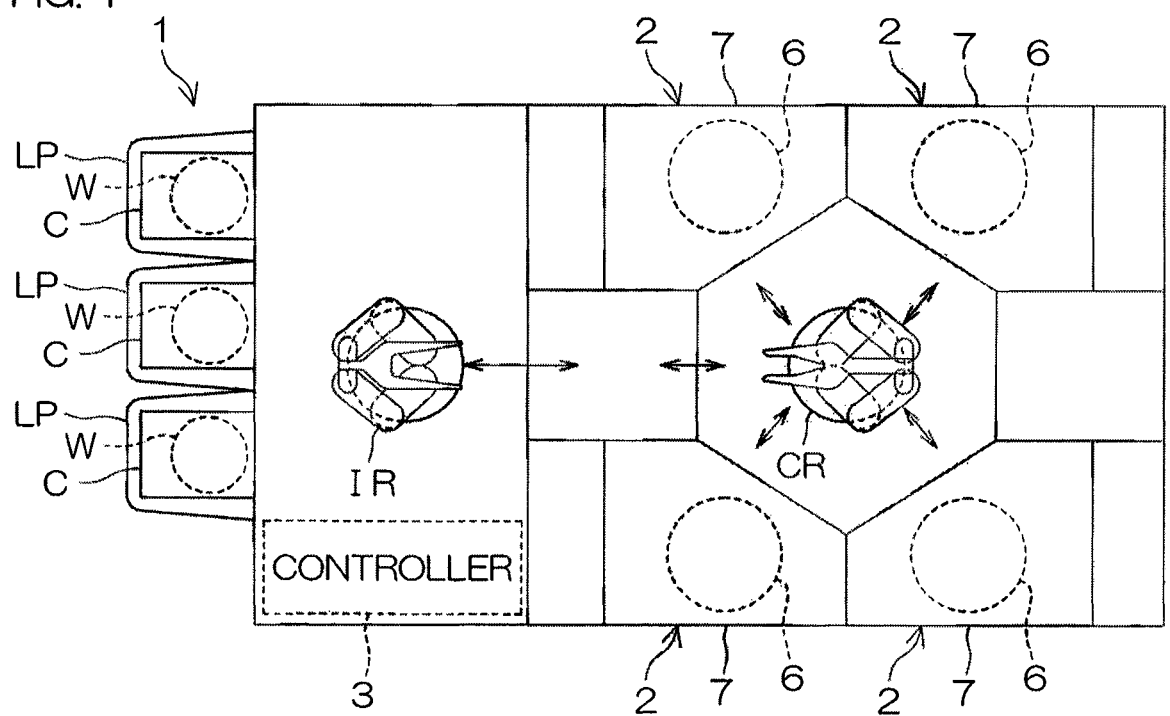
FIG. 1 is an illustrative plan view for explaining a layout of the interior of a substrate processing apparatus according to a preferred embodiment of the present invention.

FIG. 1 is an illustrative plan view for explaining a layout of the interior of a substrate processing apparatus 1 according to a preferred embodiment of the present invention. The substrate processing apparatus 1 is a single substrate processing type apparatus that processes substrates W, such as silicon wafers, one by one. In the present preferred embodiment, each of the substrates W is a circular substrate.

The substrate processing apparatus 1 includes a plurality of processing units 2 that process the substrates W, a plurality of load ports LP that respectively hold carriers C housing the plurality of substrates W to be processed by the processing units 2, transfer robots IR and CR that transfer the substrates W between the load ports LP and the processing units 2, and a controller 3 that controls the substrate processing apparatus 1. The transfer robot IR transfers the substrates W between the carriers C and the transfer robot CR. The transfer robot CR transfers the substrates W between the transfer robot IR and the processing units 2. The plurality of processing units 2 have, for example, the same configuration.

Figure 2:
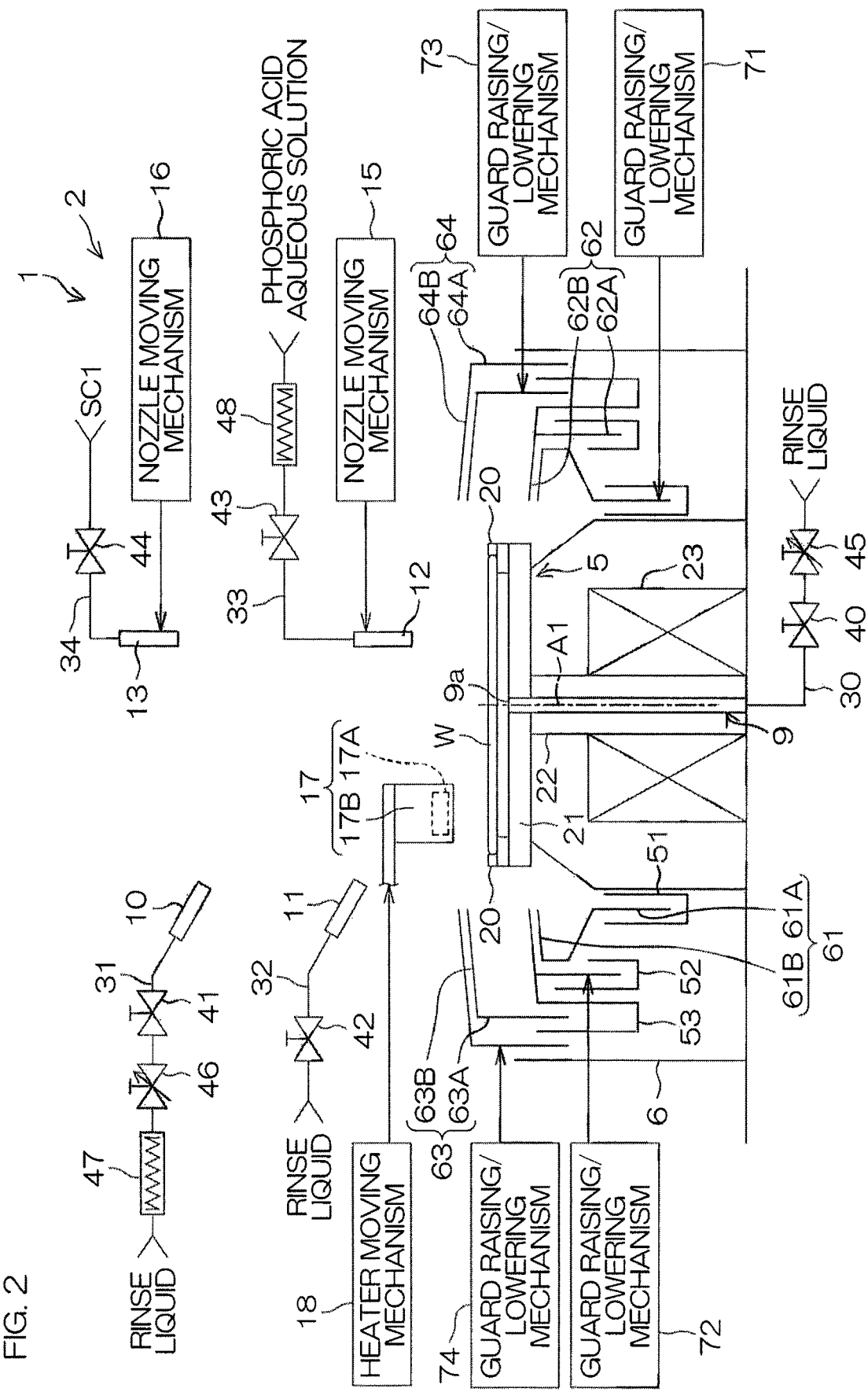
FIG. 2 is an illustrative vertical sectional view for explaining a configuration example of a processing unit included in the substrate processing apparatus.

FIG. 2 is an illustrative cross-sectional view for explaining a configuration example of the processing unit 2.

The processing unit 2 includes a spin chuck 5 and a cylindrical exhaust bucket 6. The spin chuck 5 rotates a single substrate W around a vertical rotational axis A1 passing through a central portion of the substrate W while the substrate W is held in a horizontal orientation. The exhaust bucket 6 surrounds the spin chuck 5. The processing unit 2 further includes a chamber 7 (see FIG. 1) housing the exhaust bucket 6. The chamber 7 has formed therein a carry-in/carry-out port (not shown) for carrying in and carrying out the substrate W. The chamber 7 includes a shutter unit (not shown) that opens and closes the carry-in/carry-out port.

The spin chuck 5 is included in a substrate holding/rotating unit that rotates the horizontally held substrate W around the rotational axis A1. The spin chuck 5 includes a spin base 21, a plurality of chuck pins 20, a rotating shaft 22, and an electric motor 23.

The rotating shaft 22 is coupled to a center of a lower surface of the spin base 21. The rotating shaft 22 is rotatable integrally with the spin base 21. The rotating shaft 22 extends in a vertical direction along the rotational axis A1. In the present preferred embodiment, the rotating shaft 22 is a hollow shaft. The spin base 21 has a disk shape along a horizontal direction. The plurality of chuck pins 20 are disposed at intervals in a circumferential direction at a peripheral edge portion of an upper surface of the spin base 21. An interval between the upper surface of the spin base 21 and a lower surface of the substrate W held by the spin chuck 5 is 10 mm to 11 mm (and preferably 10.4 mm).

The plurality of chuck pins 20 are supported by the spin base 21. The plurality of chuck pins 20 hold the substrate W horizontally with there being an interval upward from the upper surface of the spin base 21. The plurality of chuck pins 20 are capable of being opened and closed between a closed state and open state. In the closed state, the plurality of chuck pins 20 contact a peripheral end of the substrate W and grip the substrate W. In the open state, the plurality of chuck pins 20 are retreated from the peripheral end of the substrate W. The spin base 21 and the chuck pins 20 are included in a substrate holding unit that holds the substrate horizontally. The plurality of chuck pins 20 are included in a substrate holder that holds the substrate W horizontally with an interval upward from the upper surface of the spin base 21 (base).

The electric motor 23 applies a rotating force to the rotating shaft 22. By the rotating shaft 22 being rotated by the electric motor 23, the substrate W is rotated around the rotational axis A1. Hereinafter, an inner side in a rotation radial direction of the substrate W shall be referred to simply as the "radially inner side." Also, an outer side in the rotation radial direction of the substrate W shall be referred to simply as the "radially outer side." The rotating shaft 22 and the electric motor 23 are included in a substrate rotating unit that rotates the substrate W around the rotational axis A1.

The processing unit 2 further includes a lower rinse liquid nozzle 9, an upper first rinse liquid nozzle 10, and an upper second rinse liquid nozzle 11. The lower rinse liquid nozzle 9 is disposed lower than the substrate W and supplies DIW or other rinse liquid to the upper surface of the spin base 21. The upper first rinse liquid nozzle 10 and the upper second rinse liquid nozzle 11 are disposed higher than the substrate W and supply DIW or other rinse liquid to an upper surface of the substrate W. The rinse liquid supplied from each of the nozzles 9 to 11 is not restricted to DIW. The rinse liquid supplied from each of the nozzles 9 to 11 may be carbonated water, electrolyzed ion water, ozone water, an aqueous hydrochloric acid solution of dilute concentration (of about 10 to 100 ppm, for example), reduced water (hydrogen water), etc.

The lower rinse liquid nozzle 9 is inserted through the hollow rotating shaft 22. The lower rinse liquid nozzle 9 has, at an upper end, a discharge port 9a exposed from the upper surface of the spin base 21. The discharge port 9a is disposed at a position overlapping with the rotational axis A1 in plan view. A distance between an upper end surface of the discharge port 9a and the lower surface of the substrate W is 5 mm to 6 mm (preferably, 5.4 mm).

A lower rinse liquid supply pipe 30 is coupled to the lower rinse liquid nozzle 9. A rinse liquid is supplied from a lower rinse liquid supply source to the lower rinse liquid nozzle 9 via the lower rinse liquid supply pipe 30. A lower rinse liquid valve 40, opening and closing a flow passage inside the lower rinse liquid supply pipe 30, and a lower rinse liquid flow control valve 45, adjusting a flow rate of the rinse liquid supplied from the lower rinse liquid nozzle 9 to the upper surface of the spin base 21, are interposed in the lower rinse liquid supply pipe 30.

In the present preferred embodiment, the upper first rinse liquid nozzle 10 is a fixed nozzle disposed so as to discharge DIW or other rinse liquid toward a rotation center of the upper surface of the substrate W. The upper first rinse liquid nozzle 10 is not required to be a fixed nozzle. The upper first rinse liquid nozzle 10 may be a moving nozzle that moves at least in a horizontal direction.

An upper first rinse liquid supply pipe 31 is coupled to the upper first rinse liquid nozzle 10. A rinse liquid is supplied from an upper first rinse liquid supply source to the upper first rinse liquid nozzle 10 via the upper first rinse liquid supply pipe 31. An upper first rinse liquid valve 41, an upper rinse liquid flow control valve 46, and a rinse liquid temperature controller 47 are interposed in the upper first rinse liquid supply pipe 31.

The upper first rinse liquid valve 41 opens and closes a flow passage of the rinse liquid flowing through the upper first rinse liquid supply pipe 31. The upper rinse liquid flow control valve 46 adjusts a flow rate of the rinse liquid supplied from the upper first rinse liquid nozzle 10 to the upper surface of the substrate W. The rinse liquid temperature controller 47 adjusts the temperature of the rinse liquid supplied to the upper first rinse liquid nozzle 10 and raises the temperature of the rinse liquid supplied to the upper first rinse liquid nozzle 10 to a temperature higher than room temperature (ordinarily a temperature in a range of 15° C. to 30° C.).

The rinse liquid supplied from the upper first rinse liquid supply source to the upper first rinse liquid nozzle 10 may be adjusted in temperature in advance in the upper first rinse liquid supply source. The rinse liquid supplied from the upper first rinse liquid supply source to the upper first rinse liquid nozzle 10 may be adjusted by the rinse liquid temperature controller 47.

In the present preferred embodiment, the upper second rinse liquid nozzle 11 is a fixed nozzle disposed so as to discharge DIW or other rinse liquid toward the rotation center of the upper surface of the substrate W. The upper second rinse liquid nozzle 11 is not required to be a fixed nozzle. The upper second rinse liquid nozzle 11 may be a moving nozzle that moves at least in a horizontal direction.

An upper second rinse liquid supply pipe 32 is coupled to the upper second rinse liquid nozzle 11. A rinse liquid of room temperature (that is not temperature controlled) is supplied from an upper second rinse liquid supply source to the upper second rinse liquid nozzle 11 via the upper second rinse liquid supply pipe 32. An upper second rinse liquid valve 42 that opens and closes a flow passage inside the upper second rinse liquid supply pipe 32, is interposed in the upper second rinse liquid supply pipe 32.

The processing unit 2 further includes a first chemical liquid nozzle 12 and second chemical liquid nozzle 13, each supplying a chemical liquid to the upper surface of the substrate W. The processing unit 2 further includes an infrared heater 17 heating the chemical liquid supplied to the upper surface of the substrate W.

The first chemical liquid nozzle 12 has a function as a first processing liquid supplying unit that supplies a chemical liquid or other first processing liquid for processing the upper surface of the substrate W to the upper surface of the substrate W. The second chemical liquid nozzle 13 has a function as a second processing liquid supplying unit that supplies a chemical liquid or other second processing liquid for processing the upper surface of the substrate W to the upper surface of the substrate W.

A chemical liquid is a liquid for processing the upper surface of the substrate W. Examples of a chemical liquid include, among others, a removing liquid that removes a thin film formed on the upper surface of the substrate W or particles and other unwanted matter attached to the upper surface of the substrate W from the upper surface of the substrate W. In the present preferred embodiment, the chemical liquid supplied to the upper surface of the substrate W from the first chemical liquid nozzle 12 and the chemical liquid supplied to the upper surface of the substrate W from the second chemical liquid nozzle 13 differ from each other in type. Specifically, the first chemical liquid nozzle 12 supplies an acidic chemical liquid, such as a phosphoric acid aqueous solution, etc. Also, the second chemical liquid nozzle 13 supplies a basic chemical liquid, such as SC1 (liquid mixture of ammonia water, hydrogen peroxide water, and water), etc.

A phosphoric acid aqueous solution is an aqueous solution having phosphoric acid ($H_3PO_4$) as the main constituent. A mass percent concentration of phosphoric acid in the phosphoric acid aqueous solution is in a range, for example, of 50% to 100% (and excluding 100%). The mass percent concentration of phosphoric acid in the phosphoric acid aqueous solution is preferably about 90%. Also, it is preferable for a silicon concentration of the phosphoric acid aqueous solution to be less than a saturation concentration. The acidic chemical liquid supplied from the first chemical liquid nozzle 12 is not restricted to the phosphoric acid aqueous solution. That is, the acidic chemical liquid supplied from the first chemical liquid nozzle 12 may, for example, be sulfuric acid, SPM (a liquid mixture of sulfuric acid and hydrogen peroxide water), hydrofluoric acid (fluorhydric acid), etc. The acidic chemical liquid supplied from the first chemical liquid nozzle 12 exhibits an effect especially with respect to a chemical of high viscosity that is difficult to remove once it becomes attached to the upper surface or the lower surface of the substrate W.

The basic chemical liquid supplied from the second chemical liquid nozzle 13 is not restricted to SC1. The basic chemical liquid supplied from the second chemical liquid nozzle 13 may, for example, be a choline aqueous solution, a silylating agent, etc. As a silylating agent, a liquidmixture of propylene glycol 1-monomethyl ether 2-acetate (PGMEA) and hexamethyldisilazane (HMDS) can be cited among others.

A salt is formed by the acid chemical liquid (first processing liquid) supplied from the first chemical liquid nozzle 12 and the basic chemical liquid (second processing liquid) supplied from the second chemical liquid nozzle 13 being mixed with each other. Besides those mentioned above, the chemical liquid may be SC2 (hydrochloric acid/hydrogen peroxide mixture), buffered hydrofluoric acid (liquid mixture of hydrofluoric acid and ammonium fluoride), etc.

A first chemical liquid supply pipe 33 is coupled to the first chemical liquid nozzle 12. The acidic chemical liquid, such as the phosphoric acid aqueous solution, etc., is supplied from a first chemical liquid supply source to the first chemical liquid nozzle 12 via the first chemical liquid supply pipe 33. A first chemical liquid valve 43 and a chemical liquid temperature controller 48 are interposed in the first chemical liquid supply pipe 33. The first chemical liquid valve 43 is capable of opening and closing a flow passage inside the first chemical liquid supply pipe 33. The chemical liquid temperature controller 48 is capable of raising the temperature of the chemical liquid, supplied to the first chemical liquid nozzle 12, to a temperature higher than room temperature (ordinarily a temperature in a range of 15° C. to 30° C.). The chemical liquid temperature controller 48 may raise the temperature of the chemical liquid, supplied to the first chemical liquid nozzle 12, to 100° C. or higher. The chemical liquid supplied from the first chemical liquid supply source to the first chemical liquid nozzle 12 may be adjusted in temperature in advance in the first chemical liquid supply source. The chemical liquid supplied from the first chemical liquid supply source to the first chemical liquid nozzle 12 may be adjusted by the chemical liquid temperature controller 48.

The first chemical liquid nozzle 12 is moved in a horizontal direction and the vertical direction by a first nozzle moving mechanism 15. By being moved in the horizontal direction, the first chemical liquid nozzle 12 is enabled to move between a center position and a home position (retreat position). When being positioned at the center position, the first chemical liquid nozzle 12 faces the rotation center of the upper surface of the substrate W. The rotation center of the upper surface of the substrate W is a position of the upper surface of the substrate W that intersects the rotational axis A1. When being positioned at the home position, the first chemical liquid nozzle 12 does not face the upper surface of the substrate W. The home position of the first chemical liquid nozzle 12 is a position outside the spin base 21 in plan view. More specifically, the home position may be a position outside the exhaust bucket 6. By being moved in the vertical direction, the first chemical liquid nozzle 12 is enabled to approach the upper surface of the substrate W and retreat upward from the upper surface of the substrate W.

The first nozzle moving mechanism 15 includes, for example, a pivoting shaft, aligned along the vertical direction, an arm, coupled to the pivoting shaft and extending horizontally, and an arm driving mechanism, driving the arm. The arm driving mechanism makes the arm undergo a swinging movement by pivoting the pivoting shaft around a vertical pivoting axis. The arm driving mechanism makes the arm undergo a vertical movement by raising and lowering the pivoting shaft along the vertical direction. The first chemical liquid nozzle 12 is fixed to the arm. The first chemical liquid nozzle 12 is moved in the horizontal direction and the vertical direction in accordance with the swinging movement and raising/lowering of the arm. The arm driving mechanism includes a first motor (not shown) that rotate the arm, a ball screw (not shown) that moves the arm vertically, and a second motor (not shown) that drive the ball screw.

A second chemical liquid supply pipe 34 is coupled to the second chemical liquid nozzle 13. The basic chemical liquid, such as SC1, etc., is supplied from a second chemical liquid supply source to the second chemical liquid nozzle 13 via the second chemical liquid supply pipe 34. A second chemical liquid valve 44, opening and closing a flow passage inside the second chemical liquid supply pipe 34, is interposed in the second chemical liquid supply pipe 34.

The second chemical liquid nozzle 13 is moved in a horizontal direction and the vertical direction by a second nozzle moving mechanism 16. By being moved in the horizontal direction, the second chemical liquid nozzle 13 is enabled to move between a center position and a home position (retreat position). When being positioned at the center position, the second chemical liquid nozzle 13 faces the rotation center of the upper surface of the substrate W. When being positioned at the home position, the second chemical liquid nozzle 13 does not face the upper surface of the substrate W. The home position is a position outside the spin base 21 in plan view. More specifically, the home position may be a position outside the exhaust bucket 6. By being moved in the vertical direction, the second chemical liquid nozzle 13 is enabled to approach the upper surface of the substrate W and retreat upward from the upper surface of the substrate W.

The second nozzle moving mechanism 16 includes, for example, a pivoting shaft, aligned along the vertical direction, an arm, coupled to the pivoting shaft and extending horizontally, and an arm driving mechanism, driving the arm. The arm driving mechanism makes the arm undergo a swinging movement by pivoting the pivoting shaft around a vertical pivoting axis. The arm driving mechanism makes the arm undergo a vertical movement by raising and lowering the pivoting shaft along the vertical direction. The second chemical liquid nozzle 13 is fixed to the arm. The second chemical liquid nozzle 13 is moved in the horizontal direction and the vertical direction in accordance with the swinging movement and raising/lowering of the arm. The arm driving mechanism includes a first motor (not shown) that rotate the arm, a ball screw (not shown) that moves the arm vertically, and a second motor (not shown) that drive the ball screw.

The infrared heater 17 includes an infrared lamp 17A, emitting infrared rays, and a lamp housing 17B, housing the infrared lamp 17A. the infrared lamp 17A is disposed inside the lamp housing 17B.

The infrared lamp 17A includes, for example, a filament and a quartz tube, housing the filament. The infrared lamp 17A emits light that includes infrared rays. The light that includes infrared rays is transmitted through the lamp housing 17B and is radiated from an outer surface of the lamp housing 17B or heats the lamp housing 17B to make radiant light be radiated from its outer surface.

The infrared heater 17 is moved in a horizontal direction and the vertical direction by a heater moving mechanism 18. By being moved in the horizontal direction, the infrared heater 17 is enabled to move between a center position and a home position (retreat position). When the infrared heater 17 is positioned at the center position, a region of infrared ray irradiation of the upper surface of the substrate W is positioned at a central region that includes the rotation center of the upper surface of the substrate W. When being positioned at the home position, the infrared heater 17 does not face the upper surface of the substrate W. The home position is a position outside the spin base 21 in plan view. More specifically, the home position may be a position outside the exhaust bucket 6. By being moved in the vertical direction, the infrared heater 17 is enabled to approach the upper surface of the substrate W and retreat upward from the upper surface of the substrate W.

The heater moving mechanism 18 includes, for example, a pivoting shaft, aligned along the vertical direction, an arm, coupled to the pivoting shaft and extending horizontally, and an arm driving mechanism, driving the arm. The arm driving mechanism makes the arm undergo a swinging movement by pivoting the pivoting shaft around a vertical pivoting axis. The arm driving mechanism makes the arm undergo a vertical movement by raising and lowering the pivoting shaft along the vertical direction. The infrared heater 17 is fixed to the arm. The infrared heater is moved in the horizontal direction and the vertical direction in accordance with the swinging movement and raising/lowering of the arm. The arm driving mechanism includes a first motor (not shown) that rotate the arm, a ball screw (not shown) that moves the arm vertically, and a second motor (not shown) that drive the ball screw.

The processing unit 2 further includes a plurality of cups 51 to 53 (a first cup 51, a second cup 52, and a third cup 53) disposed between the spin chuck 5 and the exhaust bucket 6, and a plurality of guards 61 to 64 (a first guard 61, a second guard 62, a third guard 63 and a fourth guard 64) that receive the rinse liquid and the chemical liquid removed off the substrate W from the substrate W held by the spin chuck 5.

The processing unit 2 further includes a plurality of guard raising/lowering mechanisms 71 to 74 (a first guard raising/lowering mechanism 71, a second guard raising/lowering mechanism 72, a third guard raising/lowering mechanism 73 and a fourth guard raising/lowering mechanism 74) that drive the raising and lowering of the plurality of guards 43 to 45, respectively.

The plurality of cups 51 to 53 surround the spin chuck 5 at further radially outer sides than the exhaust bucket 6. Each of the cups 51 to 53 has an upwardly opening annular groove. The second cup 52 is disposed at a further radially outer side than the first cup 51. The third cup 53 is disposed at a further radially outer side than the second cup 52. The third cup 53 is, for example, integral with the second guard 62 and is raised and lowered together with the second guard 62. A recovery piping (not shown) or a waste liquid piping (not shown) is connected to the groove of each of the cups 51 to 53. The chemical liquid or rinse liquid guided to a bottom portion of each of the cups 51 to 53 is recovered or discarded through the recovery piping or the waste liquid piping.

The plurality of guards 61 to 64 surround the spin chuck 5 at further radially inner sides than the exhaust bucket 6. The first guard 61 includes a first cylindrical portion 61A, extending vertically, and a first extension portion 61B, extending radially inward from an upper end of the first cylindrical portion 61A. The second guard 62 includes a second cylindrical portion 62A of cylindrical shape, surrounding the spin chuck 5 at a further radially outer side than the first cylindrical portion 61A of the first guard 61, and a second extension portion 62B, extending radially inward from an upper end of the second cylindrical portion 62A. The third guard 63 includes a third cylindrical portion 63A of cylindrical shape, surrounding the spin chuck 5 at a further radially outer side than the second cylindrical portion 62A of the second guard 62, and a third extension portion 63B, extending radially inward from an upper end of the third cylindrical portion 63A. The fourth guard 64 includes a fourth cylindrical portion 64A of cylindrical shape, surrounding the spin chuck 5 at a further radially outer side than the third cylindrical portion 63A of the third guard 63, and a fourth extension portion 64B, extending radially inward from an upper end of the fourth cylindrical portion 64A.

Each of the guards 61 to 64 is raised and lowered between a lower position and an upper position by the corresponding one of the guard raising/lowering mechanisms 71 to 74. When the first guard 61 is positioned at the lower position, an upper end (radially inner end) of the first guard 61 is positioned lower than the substrate W. When the first guard 61 is positioned at the upper position, the upper end (radially inner end) of the first guard 61 is positioned higher than the substrate W. When the second guard 62 is positioned at the lower position, an upper end (radially inner end) of the second guard 62 is positioned lower than the substrate W. When the second guard 62 is positioned at the upper position, the upper end (radially inner end) of the second guard 62 is positioned higher than the substrate W. When the third guard 63 is positioned at the lower position, an upper end (radially inner end) of the third guard 63 is positioned lower than the substrate W. When the third guard 63 is positioned at the upper position, the upper end (radially inner end) of the third guard 63 is positioned higher than the substrate W. When the fourth guard 64 is positioned at the lower position, an upper end (radially inner end) of the fourth guard 64 is positioned lower than the substrate W. When the fourth guard 64 is positioned at the upper position, the upper end (radially inner end) of the fourth guard 64 is positioned higher than the substrate W.

Each of the guards 61 to 64 can be positioned at a substrate facing position between the lower position and the upper position. When the first guard 61 is positioned at the substrate facing position, (a radially inner end of) the extension portion 61B faces a peripheral edge of the substrate W from the radially outer side. When the second guard 62 is positioned at the substrate facing position, (a radially inner end of) the extension portion 62B faces the peripheral edge of the substrate W from the radially outer side. When the third guard 63 is positioned at the substrate facing position, (a radially inner end of) the extension portion 63B faces the peripheral edge of the substrate W from the radially outer side. When the fourth guard 64 is positioned at the substrate facing position, (a radially inner end of) the extension portion 64B faces the peripheral edge of the substrate W from the radially outer side.

Figure 3:
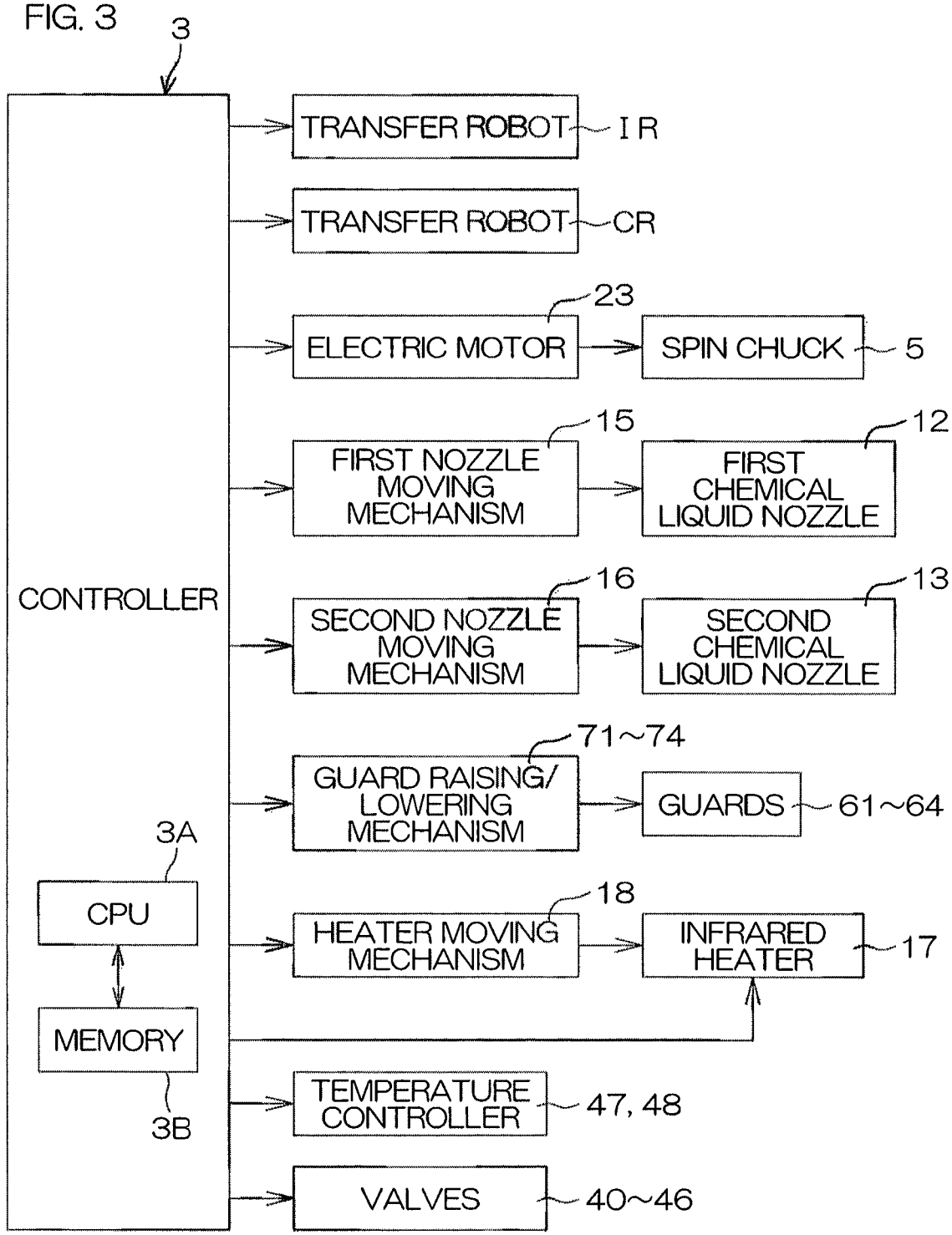
FIG. 3 is a block diagram for explaining an electrical configuration of the main portion of the substrate processing apparatus.

FIG. 3 is a block diagram for explaining an electrical configuration of the main portion of the substrate processing apparatus 1. The controller 3 includes a microcomputer, and controls control objects included in the substrate processing apparatus 1 according to a predetermined control program. More specifically, the controller 3 includes a processor (CPU) 3A and a memory 3B, in which the control program is stored, and is arranged to execute various controls for substrate processing by the processor 3A executing the control program. In particular, the controller 3 controls operations of the transfer robots IR and CR, the electric motor 23, the nozzle moving mechanisms 15 and 16, the guard raising/lowering mechanisms 71 to 74, the infrared heater 17, the heater moving mechanism 18, the temperature controllers 47 and 48, the valves 40 to 46, etc.

Figure 4:
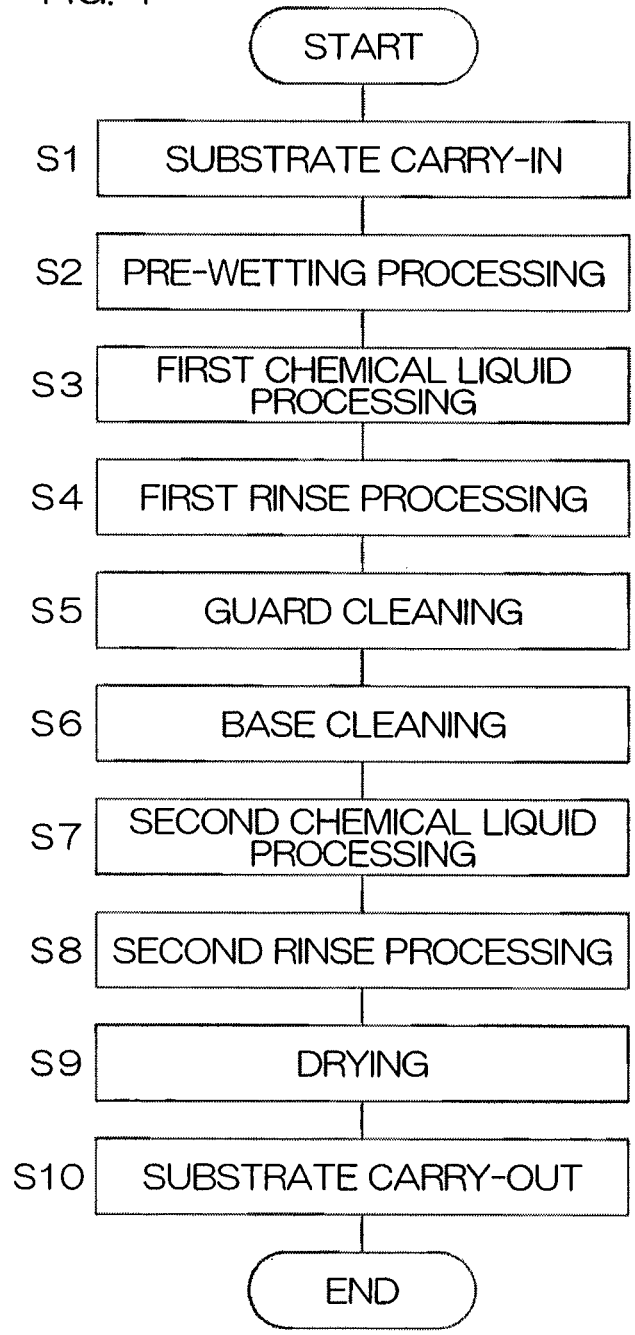
FIG. 4 is a flow diagram for explaining an example of substrate processing performed by the substrate processing apparatus.

FIG. 4 is a flowchart for explaining an example of substrate processing performed by the substrate processing apparatus 1 and mainly shows processing to be realized by the controller 3 executing the operation program.

In the substrate processing by the substrate processing apparatus 1, substrate carry-in (S1), pre-wetting processing (S2), first chemical liquid processing (S3), first rinse processing (S4), guard cleaning (S5), base cleaning (S6), second chemical liquid processing (S7), second rinse processing (S8), drying (S9), and substrate carry-out (S10) are executed in that order as shown in, for example, in FIG. 4.

First, in the substrate processing by the substrate processing apparatus 1, an unprocessed substrate W is carried from a carrier C into a processing unit 2 and delivered to the spin chuck 5 by the transfer robots IR and CR (S1). Thereafter, until being carried out by the transfer robot CR, the substrate W is held horizontally by the chuck pins 20 with there being an interval upward from the upper surface of the spin base 21 (substrate holding step). In the state where the substrate W is held horizontally by the spin chuck 5, the lower surface of the substrate W faces the upper surface of the spin base 21. The controller 3 drives the electric motor 23 to make the substrate W rotate together with the spin base 21 (substrate rotating step).

Next, after the transfer robot CR retreats out of the processing unit 2, the pre-wetting processing (S2) of supplying hot water (DIW of a temperature (for example, 60° C.) that is higher than room temperature), which is an example of a pre-wetting liquid, to the substrate W is executed. The pre-wetting liquid is a liquid for wetting the upper surface of the substrate W in advance before the substrate W is processed by chemical liquids.

Specifically, the controller 3 opens the upper first rinse liquid valve 41 to make the hot water be discharged from the upper first rinse liquid nozzle 10 toward the central region of the upper surface of the rotating substrate W. The hot water discharged from the upper first rinse liquid nozzle 10 lands on the upper surface of the substrate W and thereafter flows outward along the upper surface of the substrate W. The hot water is thus supplied to the entire upper surface of the substrate W. A liquid film of the hot water that covers the entirety of the upper surface of the substrate W is thereby formed on the substrate W.

The upper first rinse liquid nozzle 10 thus functions as a pre-wetting liquid supplying unit that supplies a rinse liquid as a pre-wetting liquid to the upper surface of the substrate W.

After the pre-wetting processing (S2) of a fixed period, the first chemical liquid processing (S3) is executed. In the first chemical liquid processing (S3), the upper surface of the substrate W is subject to etching processing while a liquid film of a chemical liquid, such as the phosphoric acid aqueous solution of high temperature, etc., is formed on the upper surface of the substrate W. FIG. 5 is an illustrative sectional view for explaining the details of the first chemical liquid processing (S3 of FIG. 4).

The rotational speed of the substrate W during the period of the first chemical liquid processing is, for example, 200 rpm. On the other hand, the controller 3 controls the guard raising/lowering mechanisms 71 to 74. The upper end (radially inner end) of the first guard 61 is thereby disposed lower than the substrate W. Also, the upper ends (radially inner ends) of the second guard 62, the third guard 63, and the fourth guard 64 are disposed higher than the substrate W.

The controller 3 then controls the first nozzle moving mechanism 15 to position the first chemical liquid nozzle 12 at a chemical liquid processing position above the substrate W. When the first chemical liquid nozzle 12 is positioned at the chemical liquid processing position, the phosphoric acid aqueous solution discharged from the first chemical liquid nozzle 12 lands on the rotation center of the upper surface of the substrate W. The controller 3 may move the first chemical liquid nozzle 12 between the center position and an outer peripheral position. When the first chemical liquid nozzle 12 is positioned at the outer peripheral position, the first chemical liquid nozzle 12 faces the peripheral edge of the substrate W. The controller 3 then closes the upper first rinse liquid valve 41 to interrupt the supplying of hot water from the upper first rinse liquid nozzle 10.

On the other hand, the controller 3 opens the first chemical liquid valve 43 to start the supplying of the chemical liquid, such as the phosphoric acid aqueous solution, etc., from the first chemical liquid nozzle 12. The phosphoric acid aqueous solution is thereby discharged from the first chemical liquid nozzle 12 toward the central region of the upper surface of the substrate W in the rotating state. A temperature of the phosphoric acid aqueous solution discharged from the first chemical liquid nozzle 12 is, for example, 160° C. to 195° C. A supply rate of the phosphoric acid aqueous solution from the first chemical liquid nozzle 12 is, for example, 1 liter/min.

The phosphoric acid aqueous solution discharged from the first chemical liquid nozzle 12 lands on the upper surface of the substrate W in the rotating state and thereafter flows to the radially outer side along the upper surface of the substrate W due to a centrifugal force. The phosphoric acid aqueous solution is thereby spread across the entirety of the upper surface of the substrate W. The hot water liquid film on the substrate W is thereby replaced by a liquid film of the phosphoric acid aqueous solution that covers the entirety of the upper surface of the substrate W. Among a silicon nitride film (SiN) and a silicon oxide film ($SiO_2$) formed on the upper surface of the substrate W, the silicon nitride film is selectively removed by the upper surface of the substrate W etched by the phosphoric acid aqueous solution in the liquid film.

The rinse liquid and the phosphoric acid aqueous solution on the substrate W in the rotating state splash to the radially outer side from the peripheral edge of the substrate W due to the centrifugal force and are received by the second cylindrical portion 62A upon passing between the first extension portion 61B of the first guard 61 and the second extension portion 62B of the second guard 62. The phosphoric acid aqueous solution received by the second cylindrical portion 62A is received by the second cup 52 (see FIG. 2). The phosphoric acid aqueous solution received by the second cup 52 after the rinse liquid on the substrate W is completely replaced by the phosphoric acid aqueous solution may be recovered and be supplied again to the substrate W. A usage amount of the phosphoric acid aqueous solution is thereby reduced.

In the first chemical liquid processing (S3), the phosphoric acid aqueous solution on the substrate W in the rotating state may become attached to the (extension portions 61B to 64B) of the plurality of guards 61 to 64 when it splashes to the radially outer side from the peripheral edge of the substrate W due to the centrifugal force. Also, in the first chemical liquid processing, a portion of the phosphoric acid aqueous solution on the substrate W in the rotating state may drop from the peripheral edge of the substrate W and become attached to the upper surface of the spin base 21.

In the first chemical liquid processing (S3), the controller 3 may start light emission from the infrared heater 17 to heat the phosphoric acid aqueous solution liquid film on the upper surface of the substrate W (chemical liquid heating step). Specifically, the controller 3 makes the heater moving mechanism 18 move the infrared heater 17 from the retreat position to a processing position. In this process, the controller 3 may move the infrared heater 17 horizontally so as to move the infrared heater 17 between the central position and an outer peripheral position. Alternatively, the controller 3 may control the heater moving mechanism 18 such that the region of infrared ray irradiation stands still at the central region of the substrate W. When the infrared heater 17 is positioned at the outer peripheral position, the region of infrared ray irradiation of the upper surface of the substrate W is positioned at an outer peripheral region that includes the peripheral edge of the substrate W. By the infrared heater 17 moving between the center position and the outer peripheral position, the phosphoric acid aqueous solution liquid film that covers the entirety of the upper surface of the substrate W is heated uniformly.

A heating temperature of the substrate W by the infrared heater 17 is set to a temperature in a vicinity of a boiling point of the phosphoric acid aqueous solution at its concentration (not less than 100° C. and, for example, a predetermined temperature within 140° C. to 195° C.). The phosphoric acid aqueous solution on the substrate W is thus heated to the boiling point at its concentration and maintained in a boiling state. Especially, when the heating temperature of the substrate W by the infrared heater 17 is set to a temperature higher than the boiling point of the phosphoric acid aqueous solution at its concentration, a temperature of an interface between the substrate W and the phosphoric acid aqueous solution is maintained at a temperature higher than the boiling point and the etching of the substrate W is promoted.

After the heating of the substrate W by the infrared heater 17 has been performed for a predetermined time, the controller 3 makes the infrared heater 17 retreat from above the substrate W and interrupts the light emission by the infrared heater 17.

Also in the first chemical liquid processing (S3), the amount of the phosphoric acid aqueous solution on the substrate W may be decreased (liquid amount decreasing step). Specifically, the controller 3 interrupts the supplying of the phosphoric acid aqueous solution from the first chemical liquid nozzle 12 to the substrate W in the rotating state. A portion of the phosphoric acid aqueous solution on the substrate W is thereby removed from the upper surface of the substrate W due to the centrifugal force and the amount of the phosphoric acid aqueous solution on the substrate W decreases. The phosphoric acid aqueous solution liquid film thus decreases in thickness. That is, the amount of the phosphoric acid aqueous solution on the substrate W decreases in a state where the entirety of the upper surface of the substrate W is covered by the phosphoric acid aqueous solution liquid film.

Next, after the first chemical liquid processing (S3) of a fixed time, the first rinse processing (S4) is executed. In the first rinse processing (S4), the chemical liquid, such as the phosphoric acid aqueous solution, etc., on the substrate W is replaced by the rinse liquid, such as DIW, etc., to remove the chemical liquid from being on the substrate W. FIG. 6 is an illustrative sectional view for explaining the details of the first rinse processing (S4 of FIG. 4).

Specifically, the controller 3 closes the first chemical liquid valve 43 and in its place, opens the upper first rinse liquid valve 41 again. The rinse liquid, such as the hot water, etc., is thereby supplied from the upper first rinse liquid nozzle 10 toward the upper surface of the substrate W in the rotating state (hot water supplying step).

The rotational speed of the substrate W during the period of the first rinse processing is, for example, maintained at the same speed (200 rpm) as the rotational speed of the substrate W during the period of the first chemical liquid processing (S3). Also, a rate at which the rinse liquid is supplied from the upper first rinse liquid nozzle 10 is 2 liters/min.

The hot water discharged from the upper first rinse liquid nozzle 10 lands on the central region of the upper surface of the substrate W in the rotating state and thereafter flows to the radially outer side along the upper surface of the substrate W due to the centrifugal force. The phosphoric acid aqueous solution liquid film on the substrate W is thus replaced by the hot water liquid film. The upper surface of the substrate W is thus cleaned by the rinse liquid, such as the hot water, etc. (substrate cleaning step). During this process, the controller 3 controls the first nozzle moving mechanism 15 to make the first chemical liquid nozzle 12 retreat from above the substrate W to a side of the exhaust bucket 6.

Next, after the first rinse processing (S4) of a fixed time, the guard cleaning (S5) is executed. In the guard cleaning (S5), the supplying of the rinse liquid, such as DIW, etc., to the upper surface of the substrate W in the rotating state is sustained to clean the guards 61 to 64 by means of the rinse liquid splashing from the substrate W. FIG. 7 is an illustrative sectional view for explaining the details of the guard cleaning (S5 of FIG. 4).

Specifically, the controller 3 controls the electric motor 23 to decelerate the rotation of the spin base 21 and set the rotational speed of the substrate W at, for example, 100 rpm to 150 rpm.

The controller 3 controls the plurality of guard raising/lowering mechanisms 71 to 74, in a state where the plurality of guards 61 to 64 are brought close to each other vertically, to position the plurality of guards 61 to 64 at the substrate facing positions. On the other hand, the supplying of the rinse liquid from the upper first rinse liquid nozzle 10 is sustained. The rinse liquid supplied from the upper first rinse liquid nozzle 10 toward the upper surface of the substrate W in the rotating state is thereby made to splash to the radially outer side of the substrate W. The extension portions 61B to 64B of the guards 61 to 64 are washed by the rinse liquid splashing to the radially outer side from the substrate W (guard cleaning step).

The phosphoric acid aqueous solution that became attached to the extension portions 61B to 64B of the guards 61 to 64 during the first chemical liquid processing (S3) is thereby removed from the extension portions 61B to 64B. The upper first rinse liquid nozzle 10 thus functions as a guard cleaning unit that cleans the guards 61 to 64 by supplying the rinse liquid to the upper surface of the substrate W.

Next, after the guard cleaning (S5) of the fixed time, the base cleaning (S6) of cleaning the spin base 21 is executed. In the base cleaning (S6), the rinse liquid, such as DIW, etc., is supplied from the lower rinse liquid nozzle 9 toward the upper surface of the spin base 21 to clean the spin base 21. FIG. 8A to FIG. 8C are illustrative sectional views for explaining the details of the base cleaning (S6 of FIG. 4).

Referring to FIG. 8A, the controller 3 opens the lower rinse liquid valve 40 to supply the rinse liquid, such as DIW, etc., from the lower rinse liquid nozzle 9 to the upper surface of the spin base 21 (rinse liquid supplying step). In the rinse liquid supplying step, the rinse liquid is supplied from the lower rinse liquid nozzle 9 to the upper surface of the spin base 21 such that the rinse liquid on the spin base 21 does not contact the lower surface of the substrate W. In the rinse liquid supplying step, it is preferable for the rinse liquid to be supplied to the upper surface of the spin base 21 such that the rinse liquid does not become attached to the lower surface of the substrate W. However, the rinse liquid discharged from the discharge port 9a of the lower rinse liquid nozzle 9 may land once on the lower surface of the substrate W and then fall down onto the spin base 21. Also, the rinse liquid that landed once on the upper surface of the spin base 21 upon being discharged from the discharge port 9a of the lower rinse liquid nozzle 9 may bounce back from the upper surface of the spin base 21 and become attached to the lower surface of the substrate W.

While the rinse liquid is being supplied from the lower rinse liquid nozzle 9 to the upper surface of the spin base 21, the controller 3 may control the lower rinse liquid flow control valve 45 to adjust the supply rate of the rinse liquid from the lower rinse liquid nozzle 9 (flow rate adjusting step). The flow rate of the rinse liquid can thereby be adjusted such that the rinse liquid bouncing back from the upper surface of the spin base 21 does not become attached to the lower surface of the substrate W. Also, the flow rate of the rinse liquid can be adjusted to a degree such that the rinse liquid discharged from the discharge port 9a of the lower rinse liquid nozzle 9 does not become attached directly to the lower surface of the substrate W.

The controller 3 controls the electric motor 23 to decelerate the rotation of the spin base 21 such that the rotational speed of the substrate W in the rinse liquid supplying step becomes lower than the rotational speed of the substrate W in the first chemical liquid supplying step (rotation decelerating step). The rotational speed of the spin base 21 after the deceleration is, for example, 10 rpm.

Referring to FIG. 8B, by sustaining the supplying of the rinse liquid from the lower rinse liquid nozzle 9 to the upper surface of the spin base 21, a liquid film 100 of the rinse liquid that covers the entirety of the upper surface of the spin base 21 without contacting the lower surface of the substrate W is formed (liquid film forming step, supply sustaining step). The controller 3 may control the lower rinse liquid flow control valve 45 to adjust the supply rate of the rinse liquid from the lower rinse liquid nozzle 9 such that the liquid film 100 does not contact the lower surface of the substrate W (flow rate adjusting step). The centrifugal force due to the rotation of the substrate W acts on the rinse liquid on the upper surface of the spin base 21. Therefore, after the liquid film 100 covering the entirety of the upper surface of the spin base 21 is formed, a portion of the rinse liquid on the upper surface of the spin base 21 splashes to the radially outer side of the substrate W. For example, if the flow rate of the rinse liquid at the discharge port 9a of the lower rinse liquid nozzle 9 is adjusted to approximately 400 cc/min and the spin base 21 is rotated at approximately 10 rpm, an interval is formed between the lower surface of the substrate W and the liquid film 100 and the liquid film 100 does not contact the lower surface of the substrate W.

In the liquid film forming step, the controller 3 controls the guard raising/lowering mechanisms 71 to 74. The upper end (radially inner end) of the first guard 61 is thereby positioned lower than the spin base 21. Also, the upper ends (radially inner ends) of the second guard 62, the third guard 63, and the fourth guard 64 are positioned at the substrate facing position or higher than the substrate W.

The rinse liquid on the spin base 21 in the rotating state splashes to the radially outer side from the peripheral edge of the substrate W due to the centrifugal force and is received by the second cylindrical portion 62A upon passing between the first extension portion 61B of the first guard 61 and the second extension portion 62B of the second guard 62. The rinse liquid received by the second cylindrical portion 62A is received by the second cup 52 (see FIG. 2).

Referring to FIG. 8C, the controller 3 closes the lower rinse liquid valve 40 to interrupt the supplying of the rinse liquid from the lower rinse liquid nozzle 9 to the spin base 21 in the rotating state (rinse liquid supply interrupting step). The centrifugal force due to the rotation of the substrate W acts on the rinse liquid on the upper surface of the spin base 21 and therefore the thickness of the liquid film 100 on the upper surface of the spin base 21 gradually becomes thin and eventually the liquid film 100 of the rinse liquid becomes removed from the upper surface of the spin base 21 (liquid film removing step). When the liquid film 100 is removed from the upper surface of the spin base 21, the controller 3 may control the electric motor 23 to accelerate the rotation of the substrate W such that the rotational speed of the substrate W in the liquid film removing step becomes higher than the rotational speed of the substrate W in the rinse liquid supplying step. The rotational speed of the substrate W in the liquid film removing step is, for example, 200 rpm. By adjusting the rotational speed of the substrate W in the liquid film removing step, the rinse liquid may be made to fall down gradually from a peripheral edge of the spin base 21 instead of making the rinse liquid splash to the radially outer side from the spin base 21. The rinse liquid can be removed from the spin base 21 by making the rinse liquid splash to the radially outer side from the spin base 21 as well.

The lower rinse liquid nozzle 9 thus functions as a base cleaning unit that cleans the upper surface of the spin base 21 by washing away the phosphoric acid aqueous solution or other chemical liquid (first processing liquid), attached to the upper surface of the spin base 21, by means of the rinse liquid. The rinse liquid supplied from the lower rinse liquid nozzle 9 to the spin base 21 is thus a cleaning liquid for washing away the chemical liquid attached to the upper surface of the spin base 21. Also, the rinse liquid supplying step corresponds to a cleaning liquid supplying step of supplying a cleaning liquid to the upper surface of the spin base 21 such that the cleaning liquid on the spin base 21 does not contact the lower surface of the substrate W.

Also, in the base cleaning (S6), the supplying of the rinse liquid from the upper first rinse liquid nozzle 10 to the upper surface of the substrate W is sustained. Drying of the upper surface of the substrate W during the base cleaning (S6) can thereby be prevented. Also, in the rinse liquid supplying step and the liquid film forming step, the substrate W rotates at a comparatively low speed and therefore the amount of rinse liquid that splashes to the radially outer side from the substrate W is comparatively low. The controller 3 may thus control the upper rinse liquid flow control valve 46 to decrease the flow rate of the rinse liquid from the upper first rinse liquid nozzle 10 in accompaniment with the deceleration of rotation of the substrate W in the rinse liquid supplying step (see FIG. 8A and FIG. 8B). Also, in the liquid film removing step, the substrate W rotates at a comparatively high speed and therefore the amount of rinse liquid that splashes to the radially outer side from the substrate W is comparatively high. The controller 3 may thus control the upper rinse liquid flow control valve 46 to increase the flow rate of the rinse liquid from the upper first rinse liquid nozzle 10 in accompaniment with the acceleration of rotation of the substrate W in the liquid film removing step (see FIG. 8C). A usage amount of the rinse liquid supplied to the upper surface of the substrate W can thereby be suppressed in the rinse liquid supplying step and the liquid film forming step. On the other hand, rinse liquid of a sufficient amount can be supplied to the upper surface of the substrate W in the liquid film removing step.

Also, the centrifugal force acts on the rinse liquid on the substrate W and the rinse liquid splashes to the radially outer side from the peripheral edge of the substrate W and therefore in the base cleaning (S6), the guards 61 to 64 can continue to be cleaned by sustaining the supplying of the rinse liquid to the upper surface of the substrate W from the upper first rinse liquid nozzle 10. That is, the guard cleaning step can be executed in parallel with the rinse liquid supplying step (the cleaning liquid supplying step), the liquid film forming step and the liquid film removing step. If in this case, the guards 61 to 64 are positioned at the substrate facing positions, the rinse liquid splashing to the radially outer side from the peripheral edge of the substrate W cleans the guards 61 to 64 and the rinse liquid splashing in a radial direction from the peripheral edge of the spin base 21 is received by the first cylindrical portion 61A of the guard 61. The rinse liquid received by the first cylindrical portion 61A is received by the first cup 51 (see FIG. 2). In the rinse liquid supplying step of the base cleaning (S6) shown in FIG. 8A to FIG. 8C, the guards 61 to 64 that position at the substrate facing positions are thus cleaned, and in the liquid film forming step and the liquid film removing step of the base cleaning (S6) shown in FIG. 8A to FIG. 8C, the guards 62 to 64 that position at the substrate facing positions are thus cleaned.

Next, after the spin base 21 is cleaned by the rinse liquid, the second chemical liquid processing (S7) is executed. In the second chemical liquid processing (S7), the upper surface of the substrate W is processed by SC1, which is an example of a chemical liquid. FIG. 9 is an illustrative sectional view for explaining the details of the second chemical liquid processing (S7 of FIG. 4).

Specifically, the controller 3 controls the electric motor 23 to maintain the rotational speed of the substrate W at, for example, 200 rpm. On the other hand, the controller 3 controls the guard raising/lowering mechanisms 71 to 74 to position the upper ends (radially inner ends) of the first guard 61, the second guard 62, and the third guard 63 lower than the substrate W and positions the upper end (radially inner end) of the fourth guard 64 higher than the substrate W.

The controller 3 then controls the second nozzle moving mechanism 16 to position the second chemical liquid nozzle 13 at a chemical liquid processing position above the substrate W. When the second chemical liquid nozzle 13 is positioned at the chemical liquid processing position, the SC1 discharged from the second chemical liquid nozzle 13 lands on the rotation center of the upper surface of the substrate W. The controller 3 may move the second chemical liquid nozzle 13 between the center position and an outer peripheral position. When the second chemical liquid nozzle 13 is positioned at the outer peripheral position, the second chemical liquid nozzle 13 faces the peripheral edge of the substrate W.

The controller 3 then opens the second chemical liquid valve 44. The SC1 is thereby discharged from the second chemical liquid nozzle 13 toward the upper surface of the substrate W in the rotating state. A supply rate of the SC1 from the second chemical liquid nozzle 13 is, for example, 1 liter/min. The SC1 discharged from the second chemical liquid nozzle 13 lands on the central region of the upper surface of the substrate W that is covered by the hot water liquid film and thereafter flows to the radially outer side along the upper surface of the substrate W due to the centrifugal force. The SC1 is thereby spread across the entirety of the upper surface of the substrate W and the hot water liquid film on the substrate W is replaced by a liquid film of the SC1 that covers the entirety of the upper surface of the substrate W.

The rinse liquid and the SC1 on the substrate W splash to the radially outer side from the peripheral edge of the substrate W due to the centrifugal force and are received by the fourth cylindrical portion 64A upon passing between the third extension portion 63B of the third guard 63 and the fourth extension portion 64B of the fourth guard 64. The SC1 received by the fourth cylindrical portion 64A is received by the third cup 53 (see FIG. 2). The SC1 received by the third cup 53 after the rinse liquid on the substrate W is replaced by the SC1 may be recovered and be supplied again to the substrate W. A usage amount of the SC1 is thereby reduced.

Next, the second rinse processing (S8) is executed. In the second rinse processing (S8), DIW, which is an example of the rinse liquid, or other rinse liquid is supplied to the substrate W and the SC1 liquid film on the substrate W is replaced by the rinse liquid.

Specifically, the controller 3 opens the upper second rinse liquid valve 42 to supply the DIW or other rinse liquid from the upper second rinse liquid nozzle 11 toward the central region of the upper surface of the substrate W. The SC1 on the substrate W is thereby forced to flow outward by the rinse liquid and is expelled to a periphery of the substrate W. The SC1 liquid film on the substrate W is thus replaced by the liquid film of the rinse liquid that covers the entire upper surface of the substrate W. When a predetermined time then elapses from the opening of the upper second rinse liquid valve 42, the controller 3 closes the upper second rinse liquid valve 42 to interrupt the discharge of the rinse liquid.

Next, the drying processing (S9) of drying the substrate W is performed.

Specifically, the controller 3 accelerates the substrate W in the rotation direction by means of the spin chuck 5 and makes the substrate W rotate at a high rotational speed (for example of 500 to 3000 rpm) that is higher than the rotational speeds of the substrate W in the pre-wetting processing (S2) to the second rinse processing (S8). A large centrifugal force is thereby made to act on the rinse liquid on the substrate W and the rinse liquid on the substrate W is spun off to the periphery of the substrate W. The rinse liquid is thus removed from the substrate W and the substrate W dries. When a predetermined time then elapses from the start of high speed rotation of the substrate W, the controller 3 interrupts the rotation of the substrate W by the spin base 21.

Thereafter, the transfer robot CR enters the processing unit 2, scoops up the processed substrate W from the spin chuck 5, and carries the substrate W out of the processing unit 2 (S10). The substrate W is delivered from the transfer robot CR to the transfer robot IR, and housed in the carrier C by the transfer robot IR. Then in an interval until a substrate W other than the previous one is carried into the processing unit 2, the upper surface of the spin base 21 may be cleaned by supplying the rinse liquid from the lower rinse liquid nozzle 9 to the upper surface of the spin base 21.

With the present preferred embodiment, the upper surface of the substrate W is etched (processed) by supplying the phosphoric acid aqueous solution or other chemical liquid (first processing liquid) to the upper surface of the substrate W held horizontally by the chuck pins 20 with an interval upward from the upper surface of the spin base 21. Even if the first processing liquid falls down from the upper surface of the substrate W and becomes attached to the upper surface of the spin base 21, the upper surface of the spin base 21 with the chemical liquid attached thereto can be washed by the DIW or other rinse liquid (cleaning liquid) by supplying the rinse liquid to the upper surface of the spin base 21 and thereafter removing the rinse liquid from the upper surface of the spin base 21. The spin base 21 can thus be cleaned before the chemical liquid attached to the spin base 21 dries. Forming of particles can thus be suppressed.

Also with the present preferred embodiment, the upper surface of the spin base 21 is cleaned in the state where the substrate W is held by the chuck pins 20. Decrease of throughput of substrate processing due to the cleaning of the spin base 21 can thus be suppressed. While the spin base 21 is being cleaned, the rinse liquid is supplied to the upper surface of the spin base 21 such that the rinse liquid on the spin base 21 does not contact the lower surface of the substrate W. A contaminant attached to the spin base 21 is thus suppressed from becoming attached to the lower surface of the substrate W via the rinse liquid.

The decrease of throughput can thus be suppressed and the base can be cleaned while contamination of the substrate W is suppressed.

Also with the present preferred embodiment, the liquid film 100 of the rinse liquid is formed on the upper surface of the spin base 21 by supplying the rinse liquid to the upper surface of the spin base 21. The upper surface of the spin base 21 is covered by the liquid film 100 and therefore the upper surface of the spin base 21 can be cleaned uniformly. In particular, by the liquid film 100 covering the peripheral edge of the upper surface of the spin base 21, the peripheral edge of the upper surface of the spin base 21 can be cleaned sufficiently in comparison to substrate processing with which the liquid film 100 is not formed on the upper surface of the spin base 21. Also with the present preferred embodiment, the liquid film 100 does not contact the lower surface of the substrate W. A contaminant attached to the spin base 21 is thus suppressed from becoming attached to the lower surface of the substrate W via the rinse liquid. The spin base 21 can thus be cleaned sufficiently while contamination of the substrate W is suppressed.

Also with the present preferred embodiment, the rinse liquid can be supplied to the upper surface of the spin base 21 such that the rinse liquid does not become attached to the lower surface of the substrate W. The rinse liquid does not become attached to the lower surface of the substrate W and contamination of the lower surface of the substrate W can thus be suppressed further.

Also with the present preferred embodiment, the substrate W rotates together with the spin base 21. The rotational speed of the substrate W in the rinse liquid supplying step (cleaning liquid supplying step) is lower than the rotational speed of the substrate W in the first chemical liquid supplying step (first processing liquid supplying step). The substrate W is thus rotated at a comparatively high speed in the first chemical liquid supplying step and therefore the upper surface of the substrate W can be etched (processed) rapidly by the phosphoric acid aqueous solution or other chemical liquid.

On the other hand, in the cleaning liquid supplying step, the spin base 21 is rotated at a comparatively low speed and therefore the centrifugal force acting on the cleaning liquid on the spin base 21 when the rinse liquid reaches the vicinity of the peripheral edge of the upper surface of the spin base 21 is reduced. The movement speed of the rinse liquid at the vicinity of the peripheral edge of the upper surface of the spin base 21 can thus be reduced. The peripheral edge of the upper surface of the spin base 21 can thus be cleaned sufficiently.

Contamination of the substrate W can thus be suppressed further while the decrease of throughput is suppressed further.

Also with the present preferred embodiment, the rinse liquid is supplied to the upper surface of the spin base 21 from the lower rinse liquid nozzle 9 that is exposed at the upper surface of the spin base 21. Therefore, there is no need to aim between the spin base 21 and the substrate W from outside the spin base 21 in supplying the rinse liquid, and the spin base 21 can thus be cleaned comparatively readily. Time required for cleaning the spin base 21 can thus be reduced. The decrease of throughput can thus be suppressed further.

Also with the present preferred embodiment, after the phosphoric acid aqueous solution or other chemical liquid (first processing liquid) is removed, together with the rinse liquid (cleaning liquid), from the spin base 21, the SC1 or other chemical liquid (second processing liquid) is supplied to the upper surface of the substrate W. The phosphoric acid aqueous solution (first processing liquid) is thus already removed from being on the spin base 21 when the SC1 (second processing liquid) is supplied to the substrate W. Therefore, even if a portion of the SC1, supplied to the substrate W, becomes attached to the upper surface of the spin base 21, the salt (particles), which is formed by the mixing of the phosphoric acid aqueous solution (acidic aqueous solution) and the SC1 (basic aqueous solution) on the spin base 21, is unlikely to form.

Contamination of the substrate W can thus be suppressed in a method where the upper surface of the substrate W is processed by the phosphoric acid aqueous solution or other acidic chemical liquid (first processing liquid) and thereafter the upper surface of the substrate W is processed by the SC1 or other basic chemical liquid (second processing liquid) that is capable of forming a salt with the former chemical liquid.

The present invention is not limited to the preferred embodiment described above but may be implemented in yet other modes.

For example, although with the preferred embodiment described above, it was stated that the first chemical liquid nozzle 12 supplies the acidic chemical liquid, such as the phosphoric acid aqueous solution, etc., and the second chemical liquid nozzle 13 supplies the basic chemical liquid, such as the SC1, etc., the properties of the chemical liquids supplied by the respective nozzles 12 and 13 may be the opposite of those in the preferred embodiment described above. That is, the first chemical liquid nozzle 12 may be arranged to supply the basic chemical liquid, such as the SC1, etc., and the second chemical liquid nozzle 13 may be arranged to supply the acidic chemical liquid, such as the phosphoric acid aqueous solution, etc. Even in this case, the same effects as the preferred embodiment described above are exhibited.

Also, unlike in the preferred embodiment described above, the chemical liquid supplied from the first chemical liquid nozzle 12 and the chemical liquid supplied from the second chemical liquid nozzle 13 may be of the same type, and the second chemical liquid processing (S7) and the second rinse processing (S8) in the substrate processing may be omitted (see FIG. 4). Even when the second chemical liquid processing (S7) and the second rinse processing (S8) are omitted, the guard cleaning (S5) and the base cleaning (S6) are executed in the state where the substrate W is held by the chuck pins 20, that is, immediately after the substrate W is processed by the first processing liquid. Forming of particles due to the first processing liquid drying by being left on the upper surface of the spin base 21 for a long period can thus be suppressed.

Also with the preferred embodiment described above, the rinse liquid is supplied to the upper surface of the substrate W from the upper first rinse liquid nozzle 10 in the pre-wetting processing (S2) and the first rinse processing (S3). Also, the rinse liquid is supplied to the upper surface of the substrate W from the upper second rinse liquid nozzle 11 in the second rinse processing (S8). However, the rinse liquid may be supplied to the upper surface of the substrate W from either of the upper first rinse liquid nozzle 10 and the upper second rinse liquid nozzle 11 in each of the pre-wetting processing (S2), the first rinse processing (S3), and the second rinse processing (S8).

Also although in the substrate processing of the preferred embodiment described above, the base cleaning (S6) is executed after the guard cleaning (S5), the guard cleaning (S5) and the base cleaning (S6) may be performed in parallel. The lowering of throughput can thereby be suppressed further.

The present application corresponds to Japanese Patent Application No. 2016-187249 filed on Sep. 26, 2016 in the Japan Patent Office, and the entire disclosure of this application is incorporated herein by reference.

Although a preferred embodiment of the present invention has been described in detail above, the preferred embodiment is merely a specific example used to clarify the technical content of the present invention and the present invention should not be interpreted as being limited to this specific example, and the scope of the present invention is limited only by the appended claims.

What is claimed is:
1. A substrate processing method comprising:
a substrate holding step of holding a substrate by means of a substrate holder which holds the substrate horizontally with an interval upward from an upper surface of a base;
a first processing liquid supplying step of supplying a first processing liquid to an upper surface of the substrate held by the substrate holder;
a base cleaning step which is executed after the first processing liquid supplying step and in which a base cleaning liquid is supplied to the upper surface of the base in a state where the substrate is held by the substrate holder such that the base cleaning liquid on the base does not contact a lower surface of the substrate;
a removing step of removing the base cleaning liquid from the upper surface of the base;
a substrate upper surface cleaning step which is executed after the first processing liquid supplying step and before the base cleaning step, and in which a substrate cleaning liquid is supplied to the upper surface of the substrate, which is held by the substrate holder, to wash away the first processing liquid on the upper surface of the substrate;
a substrate cleaning liquid supply continuing step which is executed in parallel with the base cleaning step and in which the supply of the substrate cleaning liquid to the upper surface of the substrate in the substrate upper surface cleaning step is continued; and
a rotating step of rotating the substrate, which is held by the substrate holder, together with the base around a rotational axis along a vertical direction,
wherein the rotating step includes a step of decelerating the rotation of the base such that the rotational speed of the base in the base cleaning step is lower than the rotational speed of the base in the substrate upper surface cleaning step,
the method further comprises a substrate cleaning liquid flow rate adjusting step of adjusting a flow rate of the substrate cleaning liquid which is supplied toward the upper surface of the substrate such that the flow rate of the substrate cleaning liquid which is supplied toward the upper surface of the substrate in the substrate cleaning liquid supply continuing step becomes smaller than the flow rate of the substrate cleaning liquid which is supplied toward the upper surface of the substrate in the substrate upper surface cleaning step,
the substrate cleaning liquid supply continuing step includes a step of continuing the supply of the substrate cleaning liquid toward the upper surface of the substrate even after starting of the removing step,
the rotating step includes a step of accelerating the rotation of the base such that the rotational speed of the base in the removing step is higher than the rotational speed of the base in the base cleaning step, and
the substrate cleaning liquid flow rate adjusting step includes a step of adjusting the flow rate of the substrate cleaning liquid which is supplied toward the upper surface of the substrate such that the flow rate of the substrate cleaning liquid which is supplied toward the upper surface of the substrate in the substrate cleaning liquid supply continuing step during executing the removing step becomes larger than the flow rate of the substrate cleaning liquid which is supplied toward the upper surface of the substrate in the substrate cleaning liquid supply continuing step during executing the base cleaning step.

2. The substrate processing method according to claim 1, wherein the base cleaning step includes a liquid film forming step of supplying the base cleaning liquid to the upper surface of the base to form a liquid film of the base cleaning liquid that covers the upper surface of the base without contacting the lower surface of the substrate held by the substrate holder.

3. The substrate processing method according to claim 1, wherein the base cleaning step includes a step of supplying the base cleaning liquid to the upper surface of the base such that the base cleaning liquid does not become attached to the lower surface of the substrate.

4. The substrate processing method according to claim 1, wherein the base cleaning step includes a step of supplying the base cleaning liquid to the upper surface of the base from a nozzle exposed at the upper surface of the base.

5. The substrate processing method according to claim 1, further comprising:
a second processing liquid supplying step of supplying a second processing liquid which forms a salt by being mixed with the first processing liquid supplied to the upper surface of the substrate in the first processing liquid supplying step, to the upper surface of the substrate after the removing step.

6. The substrate processing method according to claim 5, wherein the first processing liquid is one of either of an acidic aqueous solution and a basic aqueous solution, and the second processing liquid is the other of either of the acidic aqueous solution and the basic aqueous solution.

7. The substrate processing method according to claim 2, wherein the liquid film of the base cleaning liquid, which does not contact the lower surface of the substrate, is formed in the liquid film forming step by decelerating the rotation of the base in the rotating step.

8. The substrate processing method according to claim 1, further comprising: a guard positioning step of positioning a plurality of guards, each of which has a cylindrical portion surrounding the substrate in a plan view and an extension portion which extends radially inward from the cylindrical portion, in the first processing liquid supplying step such that any one of the guards receives a liquid splashed from the substrate by raising or lowering at least one of the plurality of the guards; and
a guard cleaning step of cleaning the extension portions of the plurality of the guards by the liquid from the substrate, by moving at least one of the plurality of the guards to bring the extending portions of the plurality of guards toward each other in the vertical direction, during executing the substrate upper surface cleaning step.

9. The substrate processing method according to claim 8, wherein the guard cleaning step is continued also in the substrate cleaning liquid supply continuing step.

* * * * *

UNITED STATES PATENT AND TRADEMARK OFFICE
CERTIFICATE OF CORRECTION

PATENT NO.        : 10,790,134 B2
APPLICATION NO.   : 15/700236
DATED             : September 29, 2020
INVENTOR(S)       : Hinode et al.

Page 1 of 1

It is certified that error appears in the above-identified patent and that said Letters Patent is hereby corrected as shown below:

In the Claims

Claim 8 at Column 24, Line 45, the phrase "the plurality of the guards by the liquid from the" should read -- the plurality of the guards by the liquid splashed from the --.

Signed and Sealed this
Nineteenth Day of January, 2021

Andrei Iancu
*Director of the United States Patent and Trademark Office*